US012811366B2

(12) United States Patent
Weng et al.

(10) Patent No.: US 12,811,366 B2
(45) Date of Patent: Nov. 24, 2026

(54) VERTICAL CAVITY SURFACE EMITTING LASER AND PREPARATION METHOD THEREFOR

(71) Applicant: VERTILITE CO., LTD., Jiangsu (CN)

(72) Inventors: Weicheng Weng, Jiangsu (CN); Dong Liang, Jiangsu (CN); Song Liu, Jiangsu (CN); Weizun Ding, Jiangsu (CN); Junyan Peng, Jiangsu (CN)

(73) Assignee: VERTILITE CO., LTD., Jiangsu (CN)

(*) Notice: Subject to any disclaimer, the term of this patent is extended or adjusted under 35 U.S.C. 154(b) by 515 days.

(21) Appl. No.: 18/560,552

(22) PCT Filed: Feb. 10, 2022

(86) PCT No.: PCT/CN2022/075870
§ 371 (c)(1),
(2) Date: Nov. 13, 2023

(87) PCT Pub. No.: WO2023/035549
PCT Pub. Date: Mar. 16, 2023

(65) Prior Publication Data

US 2024/0258770 A1 Aug. 1, 2024

(30) Foreign Application Priority Data

Sep. 7, 2021 (CN) ......................... 202111042430.6

(51) Int. Cl.
*H01S 5/183* (2006.01)
*H01S 5/028* (2006.01)
(Continued)

(52) U.S. Cl.
CPC ........ *H01S 5/18311* (2013.01); *H01S 5/0282* (2013.01); *H01S 5/0421* (2013.01); *H01S 5/18361* (2013.01); *H01S 5/34313* (2013.01)

(58) Field of Classification Search
CPC ............. H01S 5/18341; H01S 5/04257; H01S 5/18313; H01S 5/18347; H01S 5/18394
See application file for complete search history.

(56) References Cited

U.S. PATENT DOCUMENTS

| | | | |
|---|---|---|---|
| 10,847,950 | B2 | 11/2020 | Onishi |
| 2002/0173089 | A1 | 11/2002 | Zhu |

(Continued)

FOREIGN PATENT DOCUMENTS

| | | | |
|---|---|---|---|
| CN | 107546303 | A | 1/2018 |
| CN | 108807612 | A | 11/2018 |

(Continued)

OTHER PUBLICATIONS

Extended European Search Report issued by the European Patent Office in connection with International Application No. 22866029.6, dated Feb. 13, 2025.

(Continued)

*Primary Examiner* — Xinning(Tom) Niu
*Assistant Examiner* — Delma R Forde
(74) *Attorney, Agent, or Firm* — Carter, DeLuca & Farrell LLP; George Likourezos

(57) ABSTRACT

In the manufacturing method of a vertical cavity surface emitting laser, through the same etching process, a first passivation layer located on a side of an N-type ohmic metal layer away from a substrate is etched to form a first via on the side of the N-type ohmic metal layer away from the substrate to expose the N-type ohmic metal layer, and a first passivation layer located on a side of the P-type ohmic contact layer away from the substrate is etched in a mesa structure to form a second via on the side of the P-type ohmic contact layer away from the substrate in the mesa structure to expose the P-type ohmic contact layer.

11 Claims, 6 Drawing Sheets

(51) Int. Cl.
*H01S 5/042* (2006.01)
*H01S 5/343* (2006.01)

(56) References Cited

U.S. PATENT DOCUMENTS

| | | | | |
|---|---|---|---|---|
| 2005/0063437 | A1 | 3/2005 | Horng | |
| 2007/0291799 | A1 | 12/2007 | Konttinen | |
| 2019/0148914 | A1 | 5/2019 | Fujii et al. | |
| 2020/0412089 | A1 | 12/2020 | Mori et al. | |
| 2020/0412095 | A1* | 12/2020 | Yanagisawa | H01S 5/2206 |
| 2021/0083452 | A1* | 3/2021 | Hanaoka | H01S 5/0234 |

FOREIGN PATENT DOCUMENTS

| | | | |
|---|---|---|---|
| CN | 110768105 | A | 2/2020 |
| CN | 111313234 | A | 6/2020 |
| CN | 111711068 | A | 9/2020 |
| CN | 213636610 | U | 7/2021 |
| CN | 113783105 | A | 12/2021 |
| JP | 2004-022686 | A | 1/2004 |
| JP | 2007129012 | A | 5/2007 |
| JP | 2009188238 | A | 8/2009 |
| JP | 2010-199217 | A | 9/2010 |
| JP | 2010219342 | A | 9/2010 |
| JP | 2011009368 | A | 1/2011 |
| JP | 2011-114155 | A | 6/2011 |
| JP | 2013191784 | A | 9/2013 |
| JP | 2015099869 | A | 5/2015 |
| JP | 2016213486 | A | 12/2016 |
| JP | 2017-050463 | A | 3/2017 |
| JP | 2018093160 | A | 6/2018 |
| JP | 2018-157065 | A | 10/2018 |
| JP | 2018170469 | A | 11/2018 |
| JP | 2019-153719 | A | 9/2019 |
| JP | 2020129587 | A | 8/2020 |
| JP | 2020155771 | A | 9/2020 |
| JP | 2021-009897 | A | 1/2021 |
| JP | 2021022679 | A | 2/2021 |
| TW | 202044705 | A | 12/2020 |
| WO | 2017212888 | A1 | 12/2017 |
| WO | 2020105411 | A1 | 5/2020 |

OTHER PUBLICATIONS

Japanese Notification of Patent Grant issued by the Japanese Patent Office in connection with International Application No. 2022-540882, dated Feb. 21, 2021.

International Search Report issued in International Application No. PCT/CN2022/075870 dated Apr. 27, 2022, with English Translation.

Notice of Reasons for Refusal issued by the Japanese Patent Office on Oct. 19, 2023 in corresponding JP Patent Application No. 2022-540882, with English translation.

Office Action issued by the TW Patent Office on Jul. 19, 2023 in corresponding TW Patent Application No. 111120696, with English translation.

Office Action issued by the CN Patent Office on Apr. 20, 2022 in corresponding CN Patent Application No. 202111042430.6 with English translation.

Office Action issued by the KR Patent Office on Dec. 18, 2023 in corresponding KR Patent Application No. 10-2022-7033864, with English translation.

* cited by examiner

VERTICAL CAVITY SURFACE EMITTING LASER AND PREPARATION METHOD THEREFOR

CROSS-REFERENCE TO RELATED APPLICATIONS

This is a national stage application filed under 37 U.S.C. 371 based on International Patent Application No. PCT/CN2022/075870, filed Feb. 10, 2022, which priority to Chinese Patent Application No. 202111042430.6 filed with the China National Intellectual Property Administration (CNIPA) on Sep. 7, 2021, the disclosure of which is incorporated herein by reference in its entirety.

TECHNICAL FIELD

The present application relates to a technical field of lasers, for example, to a vertical cavity surface emitting laser and a manufacturing method thereof.

BACKGROUND

A vertical cavity surface emitting laser (VCSEL) is developed on the basis of GaAs semiconductor materials, has the advantages of small volume, circular output spot, single longitudinal mode output, low threshold current, low price, easy integration into large area array, etc., and is widely used in the applications of optical communication, optical interconnection, high power optical storage, and other fields such as industrial cutting, ranging, light detection and ranging (Lidar), and medical.

The VCSEL has attracted much attention for its excellent performance and wide application. To achieve low manufacturing cost requires high production efficiency, so the method used for manufacturing is strictly controllable. However, the manufacturing method of the VCSEL in related art has the conditions that the average total technique process time is long, and the metal consumption is large, and the manufacturing cost is high.

SUMMARY

Embodiments of the present application provide a VCSEL and a manufacturing method thereof.

In a first aspect, an embodiment of the present application provides a manufacturing method of the VCSEL, and the method includes steps described below.

A substrate is provided, and a semiconductor epitaxial structure is formed on a side of the substrate, where the semiconductor epitaxial structure includes an N-type ohmic contact layer, an N-type DBR layer, a quantum well layer, a P-type DBR layer, and a P-type ohmic contact layer which are sequentially formed on the substrate.

A trench is etched on the semiconductor epitaxial structure to form a mesa structure, where a portion of the N-type ohmic contact layer is exposed from the trench.

A current confinement layer is formed in the mesa structure, where the current confinement layer 30 has an oxide aperture for forming a emitter region of the mesa structure.

An N-type ohmic metal layer is formed on a side of the portion of the N-type ohmic contact layer away from the substrate and exposed from the trench, where a distance between the N-type ohmic metal layer and a sidewall of the trench is greater than zero.

A first passivation layer is formed on a side of the semiconductor epitaxial structure away from the substrate and on a sidewall and a bottom of the trench; and in a same etching process, a first passivation layer located on a side of the N-type ohmic metal layer away from the substrate is etched to form a first via on a side of the N-type ohmic metal layer away from the substrate to expose the N-type ohmic metal layer, and a first passivation layer located on a side of the P-type ohmic contact layer away from the substrate is etched in the mesa structure to form a second via on a side of the P-type ohmic contact layer away from the substrate in the mesa structure to expose the P-type ohmic contact layer.

In a same metal deposition process, a first electrode layer is formed in the first via, and a P-type ohmic metal layer and a second electrode layer are sequentially formed in the second via.

In a second aspect, an embodiment of the present application provides a VCSEL, and the VCSEL includes a substrate, a semiconductor epitaxial structure located on a side of the substrate, an N-type ohmic metal layer, a first passivation layer, a first electrode layer, a P-type ohmic metal layer and a second electrode layer.

The semiconductor epitaxial structure includes an N-type ohmic contact layer, an N-type DBR layer, a quantum well layer, a P-type DBR layer, and a P-type ohmic contact layer sequentially laminated on the substrate, the semiconductor epitaxial structure includes a trench and a mesa structure surrounded by the trench, a portion of the N-type ohmic contact layer is exposed from the trench, the mesa structure includes a current confinement layer, and the current confinement layer has an oxide aperture for forming a emitter region of the mesa structure.

The N-type ohmic metal layer is located on a bottom of the trench, and a distance between the N-type ohmic metal layer and a sidewall of the trench is greater than zero.

The first passivation layer is located on a side of the semiconductor epitaxial structure away from the substrate, and on a sidewall and a bottom of the trench, the first passivation layer includes a first via and a second via, the N-type ohmic metal layer is exposed from the first via, the P-type ohmic contact layer in the mesa structure is exposed from the second via, and the first via and the second via are formed in a same etching process.

The first electrode layer is in contact with the N-type ohmic metal layer exposed from the first via, the P-type ohmic metal layer is in contact with the P-type ohmic contact layer exposed from the second via, the second electrode layer is located on a side of the P-type ohmic metal layer away from the P-type ohmic contact layer, and the first electrode layer, the P-type ohmic metal layer and the second electrode layer are formed in a same metal deposition process.

DETAILED DESCRIPTION

The present application is described hereinafter in conjunction with drawings and embodiments.

In related art, a VCSEL is developed on the basis of GaAs semiconductor materials, which is different from other light sources such as light emitting diode (LED) and laser diode (LD). The VCSEL has the advantages of small volume, circular output spot, single longitudinal mode output, low threshold current, low price, easy integration into large area array, etc., and is widely used in the applications of optical communication, optical interconnection, high power optical storage, and other fields such as industrial cutting, ranging, light detection and ranging (Lidar), and medical. The VCSEL has attracted much attention for its excellent performance and wide application. To achieve low manufacturing cost requires high production efficiency, so the method used for manufacturing is strictly controllable. In related art, in the process of manufacturing the VCSEL, a P-type ohmic metal layer and an N-type ohmic metal layer are successively formed on opposite sides of the substrate or on the same side of the substrate by two times metal deposition process, and the process time is long, and a plurality of photomasks and more metal consumptions are required. In addition, in related art, in the case where the P-type ohmic metal layer and the N-type ohmic metal layer are located on the same side of the substrate, after the passivation layer is formed on the sides of the P-type ohmic metal layer and the N-type ohmic metal layer far away from the substrate, an via is provided on the P-type ohmic metal layer and an via is provided on the N-type ohmic metal layer by different times of etching process, so as to manufacture pads on the P-type ohmic metal layer and the N-type ohmic metal layer, which also has a long process time and a complex manufacturing method. According to statistics, it is found that the number of the main process types is greater than 11 steps, the number of photomasks is greater than 7, the number of metallization times is greater than 5, and the average total process cycle time is greater than 3 weeks, which are the basic condition of the main process. As can be seen, there is an urgent need to reduce time and cost in the field.

Figure 1:
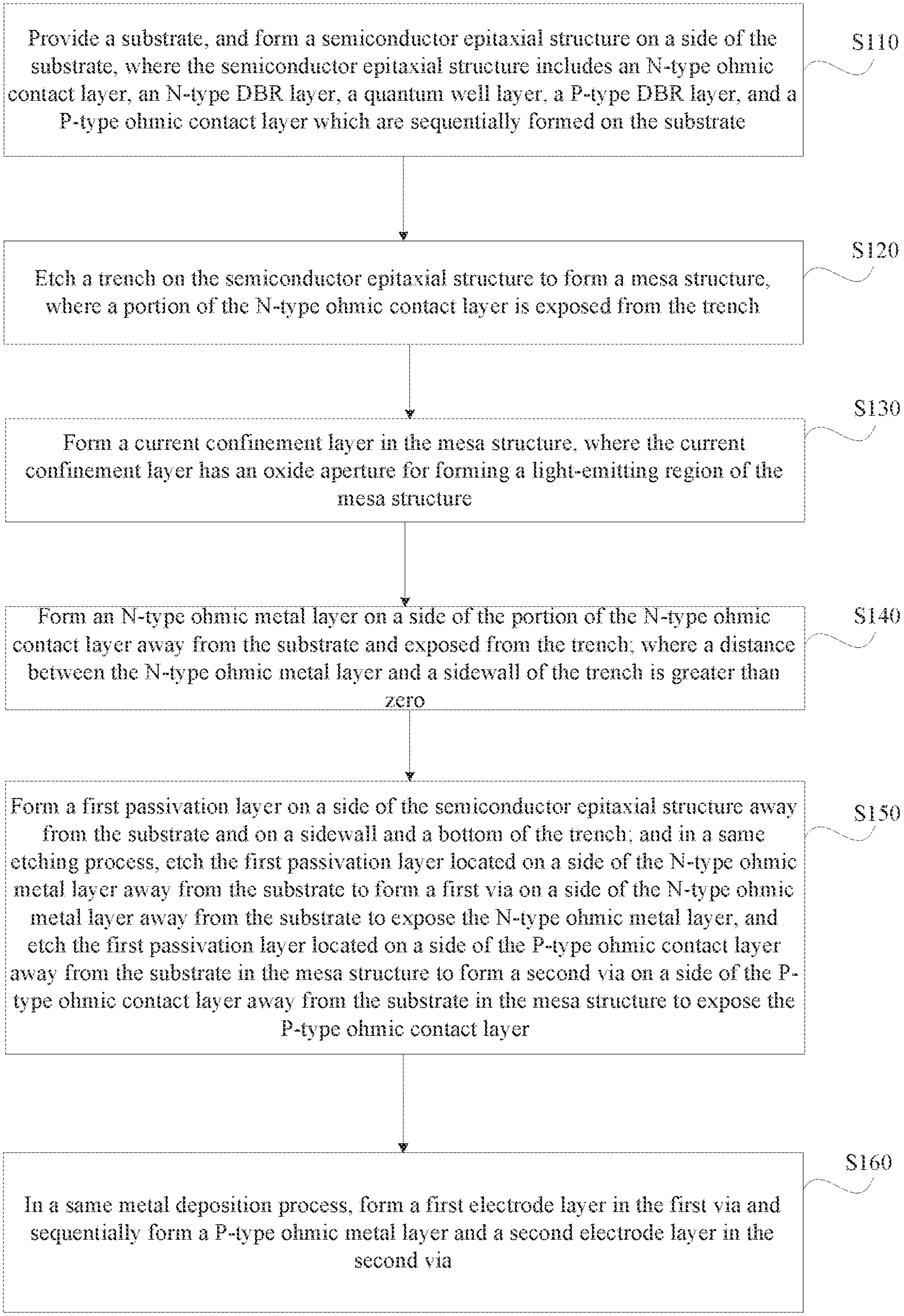
FIG. 1 is a flowchart of a manufacturing method of a VCSEL according to an embodiment of the present application.

In view of the above, an embodiment of the present application provides a manufacturing method of the VCSEL. FIG. 1 is a flowchart of a manufacturing method of a VCSEL according to an embodiment of the present application. Referring to FIG. 1, the method includes steps described below.

In S110, a substrate is provided, and a semiconductor epitaxial structure is formed on a side of the substrate, where the semiconductor epitaxial structure includes an N-type ohmic contact layer, an N-type DBR layer, a quantum well layer, a P-type DBR layer, and a P-type ohmic contact layer which are sequentially formed on the substrate.

Figure 2:
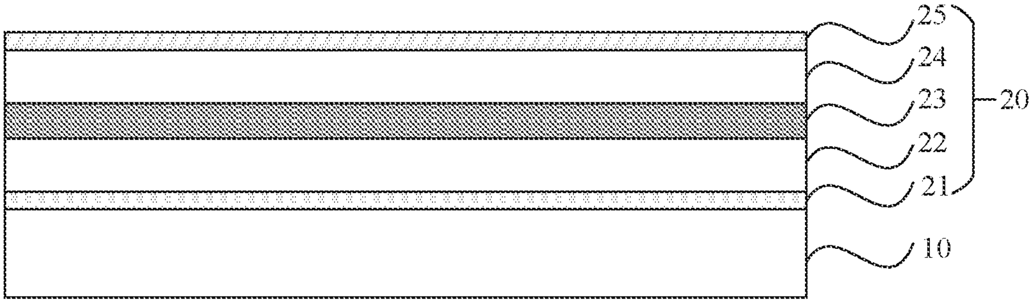
FIG. 2 is a sectional view of a structure manufactured in step S110 in a manufacturing method of a VCSEL according to an embodiment of the present application.

For example, FIG. 2 is a sectional view of a structure manufactured in step S110 in a manufacturing method of a VCSEL according to an embodiment of the present application. Referring to FIG. 2, a substrate 10 is provided, and the substrate 10 may use any material suitable for forming the VCSEL, such as gallium arsenide (GaAs). The substrate 10 may be an N-type doped semiconductor substrate or a P-type doped semiconductor substrate. In this embodiment, the substrate 10 is the N-type doped semiconductor substrate. Since the N-type ohmic metal layer and the P-type ohmic metal layer are formed on the same side of the substrate 10 in the subsequent manufacturing process, the substrate 10 does not need to act as conductors to conduct the N-type ohmic metal layer and the P-type ohmic metal layer with respect to the case where the N-type ohmic metal layer and the P-type ohmic metal layer are formed on both opposite sides of the substrate 10. That is, in this embodiment, the N-type doped semiconductor substrate has a weak conductivity or is non-conductive. In some embodiments, the substrate 10 may be a sapphire substrate or other material substrate, or at least the top surface of substrate 10 is composed of one of silicon, gallium arsenide, silicon carbide, aluminum nitride, and gallium nitride.

The semiconductor epitaxial structure 20 is formed on a side of the substrate 10, where the semiconductor epitaxial structure 20 includes the N-type ohmic contact layer 21, the N-type distributed Bragg reflection (DBR) layer 22, the quantum well layer 23, the P-type DBR layer 24, and the P-type ohmic contact layer 25 which are sequentially formed on the substrate. The N-type ohmic contact layer 21, the N-type DBR layer 22, the quantum well layer 23, the P-type DBR layer 24 and the P-type ohmic contact layer 25 may be formed by means of chemical vapor deposition. The N-type ohmic contact layer 21 is a current diffusion layer, the material of the N-type ohmic contact layer 21 may be a highly doped GaAs material, and the highly doped GaAs material has good conductivity. Similarly, the P-type ohmic contact layer 25 is a current diffusion layer, the material of the P-type ohmic contact layer 25 may be a highly doped GaAs material to facilitate forming ohmic contact with a subsequently deposited P-type ohmic metal layer. The N-type DBR layer 22 is formed by laminating two materials having different refractive indices of the aluminum gallium arsenic material layer and the gallium arsenide material layer, or by laminating two materials having different refractive indices of the aluminum gallium arsenic material layer having a high aluminum component and the aluminum gallium arsenic material layer having a low aluminum component. The quantum well layer 23 is an active layer, including laminated quantum well composite structures, which is formed by materials of GaAs and AlGaAs, or InGaAs and AlGaAs, and the quantum well layer 23 is used for converting electric energy into light energy. The P-type DBR layer 24 is formed by laminating two materials having different refractive indices of the aluminum gallium arsenic material layer and the gallium arsenide material layer, or by laminating two materials having different refractive indices of the aluminum gallium arsenic material layer having the high aluminum component and the aluminum gallium arsenic material layer having the low aluminum component. The N-type DBR layer 22 and the P-type DBR layer 24 are used for enhancing the reflection of light generated by the active layer in the middle, and then emitted from the surface of the P-type DBR layer 24 to form laser beam.

In some embodiments, the N-type DBR layer 22 and the P-type DBR layer 24 each include a series of alternating layers having different refractive index materials, where an effective optical thickness (the thickness of the each alternating layer multiplied by refractive index of the each alternating layer) of each alternating layer in the series of alternating layers is an odd integer multiple of one quarter of operating wavelength of the VCSEL, i.e., the effective optical thickness of each alternating layer is one quarter of an odd integer multiple of operating wavelength of the VCSEL. In some embodiments, the N-type DBR layer 22 and the P-type DBR layer 24 may also be formed by other materials.

In some embodiments, the N-type ohmic contact layer 21 may be formed between the substrate 10 and the N-type DBR layer 22, that is, the N-type ohmic contact layer 21 is first grown on the substrate 10, and then the N-type DBR layer 22 is grown on the N-type ohmic contact layer 21. The N-type ohmic contact layer 21 may be formed among the N-type DBR layers 22, that is, a portion of the N-type DBR layer 22 is first grown on the substrate 10, then the N-type ohmic contact layer 21 is grown on the grown portion of the N-type DBR layer 22, and then another portion of the N-type DBR layer 22 is grown on the N-type ohmic contact layer 21.

In S120, a trench is etched on the semiconductor epitaxial structure to form a mesa structure, where a portion of the N-type ohmic contact layer is exposed from the trench.

Figure 3:
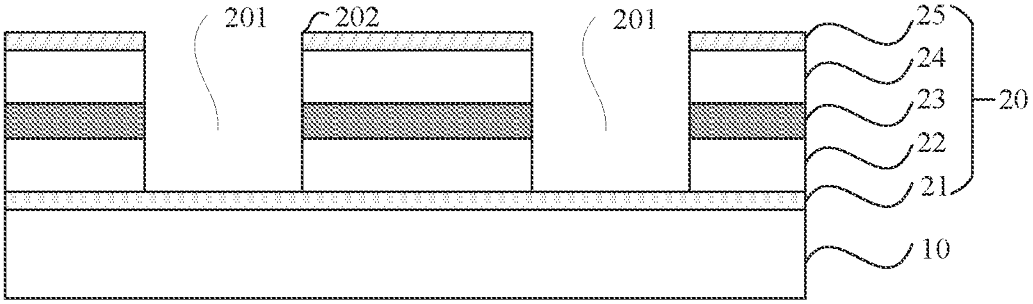
FIG. 3 is a sectional view of a structure manufactured in step S120 in a manufacturing method of a VCSEL according to an embodiment of the present application.

For example, FIG. 3 is a sectional view of a structure manufactured in step S120 in a manufacturing method of a VCSEL according to an embodiment of the present application. Referring to FIG. 3, the trench 201 is etched on the semiconductor epitaxial structures 20 by means of wet/dry etch to form the mesa structures 202. The P-type ohmic contact layer 25 is etched downward (in a direction towards the substrate 10) by an etching process, at least a portion of the N-type ohmic contact layer 21 is exposed from the formed trench 201 to form a manufacturing position during the subsequent manufacturing of the N-type ohmic metal layer 40, the N-type ohmic metal layer 40 needs to be in contact with the N-type ohmic contact layer 21 to achieve the ohmic contact between the N-type ohmic metal layer 40 and the N-type ohmic contact layer 21, so that a current can flow from the N-type ohmic contact layer 21 to the N-type ohmic metal layer 40 to provide electric energy for the mesa structure 202.

In S130, a current confinement layer is formed in the mesa structure, where the current confinement layer has an oxide aperture for forming a light-emitting region of the mesa structure.

Figure 4:
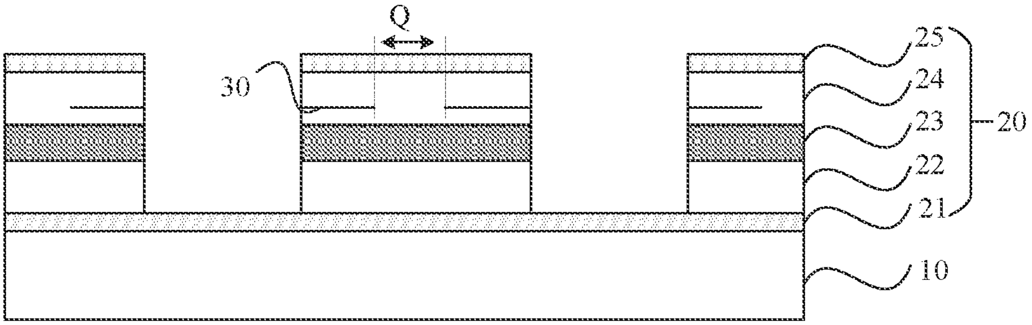
FIG. 4 is a sectional view of a structure manufactured in step S130 in a manufacturing method of a VCSEL according to an embodiment of the present application.

For example, FIG. 4 is a sectional view of a structure manufactured in step S130 in a manufacturing method of a VCSEL according to an embodiment of the present application. Referring to FIGS. 3 and 4, in this embodiment, the sidewall of the trench 201 is oxidized by wet oxidizing a highly aluminum doped material under a certain temperature condition, so as to form a current confinement layer 30 in the P-type DBR layer 24. The current confinement layer 30 has the oxide aperture, and the oxide aperture is used for defining the light-emitting region Q of the mesa structure 202. The lengths of the current confinement layers 30 on both sides of the trench 201 formed by the oxide aperture are equal (for example, the lengths of the four current confinement layers 30 shown in FIG. 4 are equal, in an example, the sidewall of the trench 201 is oxidized, and due to the same aluminum component and the same oxidation conditions, the length of the oxidation is the same when the width of the mesa (regardless of whether the mesa is a emitter or a dummy mesa) is the same. The alumina formed has high impedance after being oxidized, and the oxide aperture position of the current confinement layer 30 is still a high aluminum doped aluminum gallium arsenic material. After the current enters the mesa structure 202, the current will flow to the active layer through the oxide aperture in the current confinement layer 30. In this embodiment, the current confinement layer 30 in each mesa structure is a circular ring structure, and when the top view of the mesa structure is a rectangle, the current confinement layer 30 may also be a rectangular ring.

For another example, the current confinement layer 30 is formed in the high aluminum-containing oxidation layer on the quantum well layer 23.

In S140, an N-type ohmic metal layer is formed on a side of the portion of the N-type ohmic contact layer away from the substrate and exposed from the trench, where a distance between the N-type ohmic metal layer and a sidewall of the trench is greater than zero.

Figure 5:
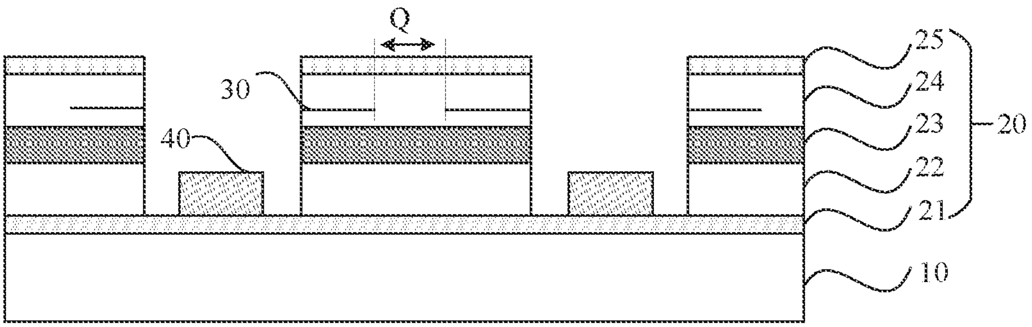
FIG. 5 is a sectional view of a structure manufactured in step S140 in a manufacturing method of a VCSEL according to an embodiment of the present application.

For example, FIG. 5 is a sectional view of a structure manufactured in step S140 in a manufacturing method of a VCSEL according to an embodiment of the present application. Referring to FIG. 5, the N-type ohmic metal layer 40 is formed by selective technical means of evaporation, sputtering, electroplating, chemical plating, or the like according to the product design and the topographic processing requirements of different patterns. Before the N-type ohmic metal layer 40 is formed, a photoresist layer may be formed in the trench 201, and then the photoresist layer may be patterned by exposure development to form a photoresist pattern. The photoresist layer is removed after depositing the metal layer based on the photoresist pattern, so that the metal layer deposited on the photoresist layer is simultaneously removed while the photoresist layer is removed. The metal layer on the opening position of the photoresist pattern is reserved, and the reserved metal layer forms the N-type ohmic metal layer 40. The distance between the N-type ohmic metal layer 40 and the side of the trench 201 is greater than zero, and direct contact between the N-type ohmic metal layer 40 and the mesa structure 202 is prevented.

The ohmic metal layer can also be referred to as the ohmic contact layer, and the ohmic metal layer and the ohmic contact layer are distinguished only for distinguishing different objects.

In S150, a first passivation layer is formed on a side of the semiconductor epitaxial structure away from the substrate and on a sidewall and a bottom of the trench; and in a same etching process, a first passivation layer located on a side of the N-type ohmic metal layer away from the substrate is etched to form a first via on a side of the N-type ohmic metal layer away from the substrate to expose the N-type ohmic metal layer, and a first passivation layer located on a side of the P-type ohmic contact layer away from the substrate in the mesa structure is etched to form a second via on a side of the P-type ohmic contact layer away from the substrate in the mesa structure to expose the P-type ohmic contact layer.

Figure 6:
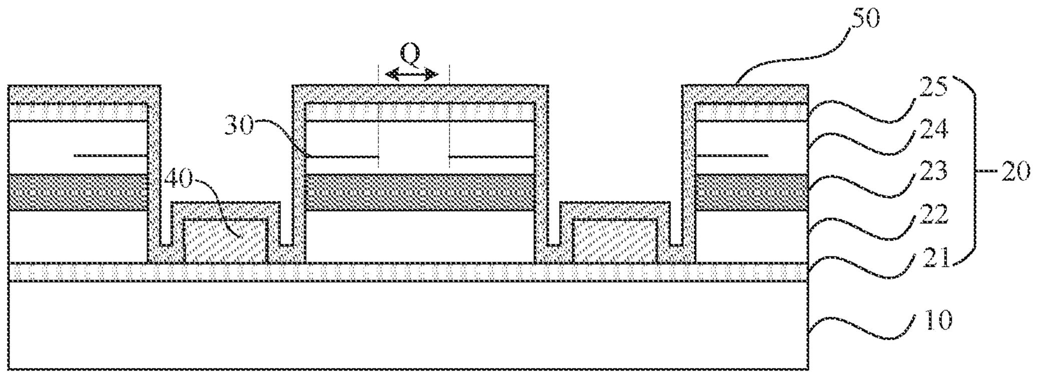
FIG. 6 is a first structure sectional view of a structure manufactured in step S150 in a manufacturing method of a VCSEL according to an embodiment of the present application.
Figure 7:
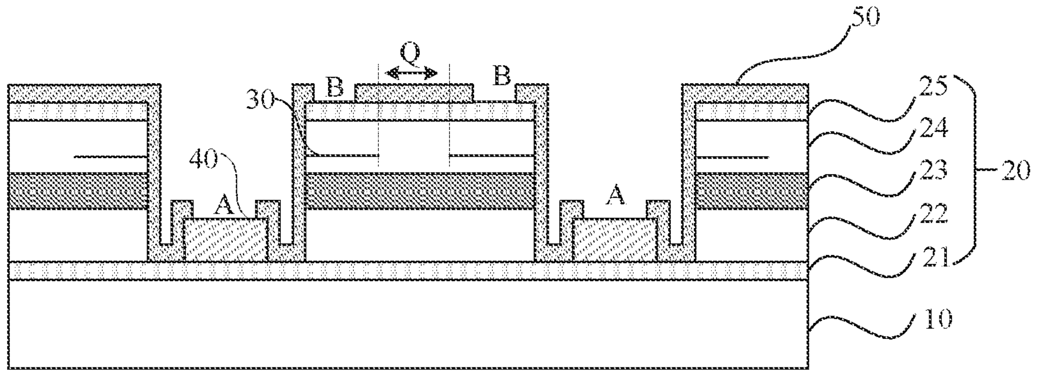
FIG. 7 is a second structure sectional view of a structure manufactured in step S150 in a manufacturing method of a VCSEL according to an embodiment of the present application.

For example, FIG. 6 is a first structure sectional view of a structure manufactured in step S150 in a manufacturing method of a VCSEL according to an embodiment of the present application, and FIG. 7 is a second structure sectional view of a structure manufactured in step S150 in a manufacturing method of a VCSEL according to an embodiment of the present application. Referring to FIGS. 6 and 7, after the current confinement layer 30 and the N-type ohmic metal layer 40 are formed, an insulating layer, i.e., the first passivation layer 50, is formed on the semiconductor epitaxial structure 20. The formed first passivation layer 50 covers the surface of the side of the semiconductor epitaxial structure 20 away from the substrate 10 and the sidewall and the bottom of the trench 201. The material of the first passivation layer 50 may be silicon nitride or silicon oxide or other insulating material and may be formed by chemical vapor deposition. The first passivation layer 50 may protect the current confinement layer 30 and may further effectively isolate adjacent mesa structures. After the first passivation layer 50 is formed on the side of the semiconductor epitaxial structure 20 away from the substrate 10 and on the sidewall and the bottom of the trench 201; and in the same etching process, the first passivation layer 50 located on the side of the N-type ohmic metal layer 40 away from the substrate 10 is etched to form the first via A on the side of the N-type ohmic metal layer 40 away from the substrate 10 to expose the N-type ohmic metal layer 40, and the first passivation layer 50 located on the side of the P-type ohmic contact layer 25 away from the substrate 10 in the mesa structure 202 is etched to form the second via B on the side of the P-type ohmic contact layer 25 away from the substrate 10 in the mesa structure 202 to expose the P-type ohmic contact layer 25. In the embodiment of the present application, the first passivation layer 50 on the side of the N-type ohm metal layer 40 away from the substrate 10 is etched in the single etching process, the number of times of via etching process is reduced, the process time is shortened, and the manufacturing efficiency of the laser is improved.

In S160, in a same metal deposition process, a first electrode layer is formed in the first via, and a P-type ohmic metal layer and a second electrode layer are sequentially formed in the second via.

Figure 8:
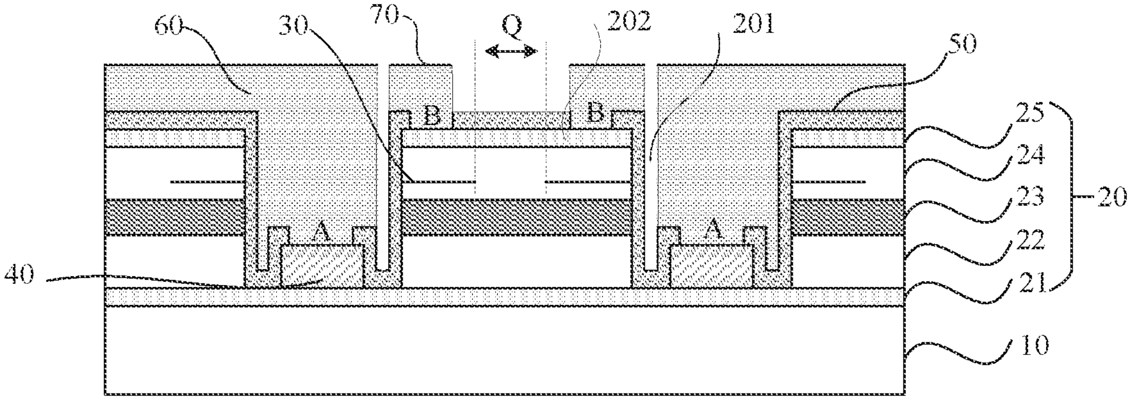
FIG. 8 is a sectional view of a structure manufactured in step S160 in a manufacturing method of a VCSEL according to an embodiment of the present application.

For example, FIG. 8 is a sectional view of a structure manufactured in step S160 in a manufacturing method of a VCSEL according to an embodiment of the present application. Referring to FIG. 8, in the same metal deposition process, the first electrode layer 60 is formed in the first via A, and the P-type ohmic metal layer and the second electrode layer 70 (FIG. 8 exemplarily shows the first electrode layer 60 and the second electrode layer 70, the P-type ohmic metal layer is not shown, and the second electrode layer and the P-type ohmic metal layer may be the same layer) are sequentially formed in the second via B, and the formed first electrode layer 60 and the formed second electrode layer 70 are not in contact. The same metal deposition process is understood to mean that the first electrode layer 60 in the first via A, and the P-type ohmic metal layer and the second electrode layer 70 in the second via B are formed by simultaneously depositing the same metal material (such as Ti, Pt, Au, Ge or Pd). Similarly, the photoresist layer may be coated before the metal deposition process is performed, and the photoresist layer may be subjected to exposure development to form the photoresist pattern. So that the photoresist layer is covered on the side of the first passivation layer 50 away from the substrate 10, and is covered in a region where there is no contact between the first electrode layer 60 and the second electrode layer 70. After the metal layer is deposited, the metal layer attached to the photoresist layer is removed while the photoresist layer is removed, that is, the first electrode layer 60 and the second electrode layer 70 which are in no contact can be formed. The single metal deposition process enables the N-type ohmic metal layer 40 to be bonded to the cathode pad metal (the first electrode layer 60), the P-type ohmic metal layer to be bonded to the P-type ohmic contact layer 25, and the P-type ohmic metal layer to be bonded to the anode pad metal (the second electrode layer 70). After the laser is formed, the P-type ohmic metal layer and the N-type ohmic metal layer 40 are located on the same side of the substrate 10. Thereby not only reducing the number of photomasks and processes, reducing the number of times of metal deposition process and shortening the manufacturing cycle time of the laser, thus improving the manufacturing efficiency of the laser, but also reducing the metal consumptions and the manufacturing cost of the laser.

According to the manufacturing method of the VCSEL provided in the embodiment of the present application, in the same etching process, the first passivation layer located on the side of the N-type ohmic metal layer away from the substrate is etched to form the first via on the side of the N-type ohmic metal layer away from the substrate to expose the N-type ohmic metal layer, and the first passivation layer located on the side of the P-type ohmic contact layer away from the substrate is etched in the mesa structure 202 to form the second via on the side of the P-type ohmic contact layer away from the substrate in the mesa structure 202 to expose the P-type ohmic contact layer, so that the number of times of via etching process is reduced, and in the same metal deposition process, the first electrode layer is formed in the first via, and the P-type ohmic metal layer and the second electrode layer are sequentially formed in the second via, thus reducing the number of times of metal deposition process and reducing the metal consumptions, further improving the manufacturing efficiency of the laser, shortening the manufacturing cycle time of the laser, and reducing the manufacturing cost of the laser.

In an embodiment, a layer formed by metal deposition in the second via B can simultaneously function as a P-type ohmic contact and an electrode, that is, the P-type ohmic metal layer and the second electrode layer can be completed at one time or are the same layer.

In an embodiment, a second passivation layer is further provided between the first passivation layer on the side of the semiconductor epitaxial structure away from the substrate, and the semiconductor epitaxial structure, before the semiconductor epitaxial structure is etched to form the trench, the method further includes: forming the second passivation layer on the side of the semiconductor epitaxial structure away from the substrate, and etching a second passivation layer located in a region where the trench is located to expose a semiconductor epitaxial structure to be etched.

Figure 9:
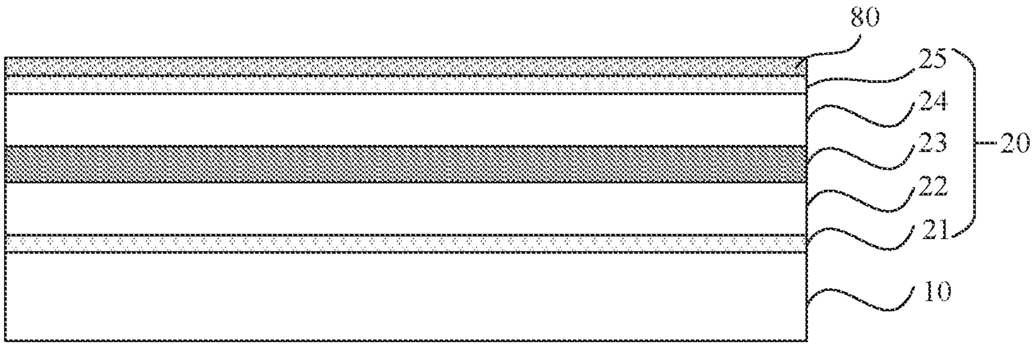
FIG. 9 is a sectional view of a structure in which a second passivation layer is formed in a manufacturing method of a VCSEL according to an embodiment of the present application.
Figure 10:
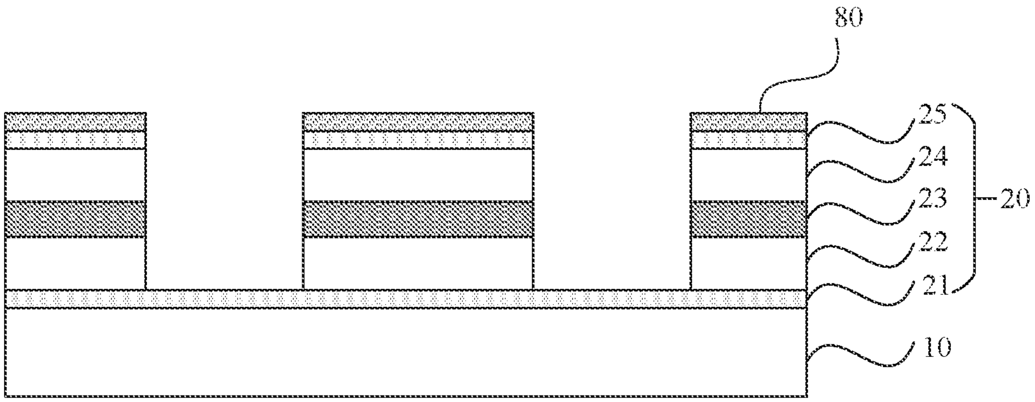
FIG. 10 is a sectional view of a structure in which a second passivation layer is etched in a manufacturing method of a VCSEL according to an embodiment of the present application.

For example, FIG. 9 is a sectional view of a structure in which a second passivation layer 80 is formed in a manufacturing method of a VCSEL according to an embodiment of the present application. Referring to FIG. 9, before the semiconductor epitaxial structure 20 is etched to form the trench 201, the second passivation layer 80 is formed on the side of the semiconductor epitaxial structure 20 away from substrate 10. The material of the second passivation layer 80 may be the silicon nitride or the silicon oxide or other insulating material, and the second passivation layer 80 may be formed by means of chemical vapor deposition. The second passivation layer 80 is used for protecting the semiconductor epitaxial layer structure 20, preventing external water and oxygen from damaging the surface of the semiconductor epitaxial layer structure 20, thus satisfying the manufacturing conditions such as the high-performance of the laser, high-topography processing requirements of the laser and the like. FIG. 10 is a sectional view of a structure in which a second passivation layer is etched in a manufacturing method of a VCSEL according to an embodiment of the present application. Referring to FIG. 10, after the second passivation layer 80 in a region where the trench 201 is located is etched to expose the semiconductor epitaxial structures 20 to be etched, the semiconductor epitaxial structure 20 is continuously etched to form the trench 201.

In an embodiment, the number of mesa structure 202 is one, and forming the N-type ohmic metal layer 40 on the side of the portion of the N-type ohmic contact layer 21 away from the substrate 10 and exposed from the trench 201 includes: forming the N-type ohmic metal layer 40 on the side of the N-type ohmic contact layer 21 away from the substrate 10 along a direction in which the trench 201 surrounds one mesa structure 202.

Figure 11:
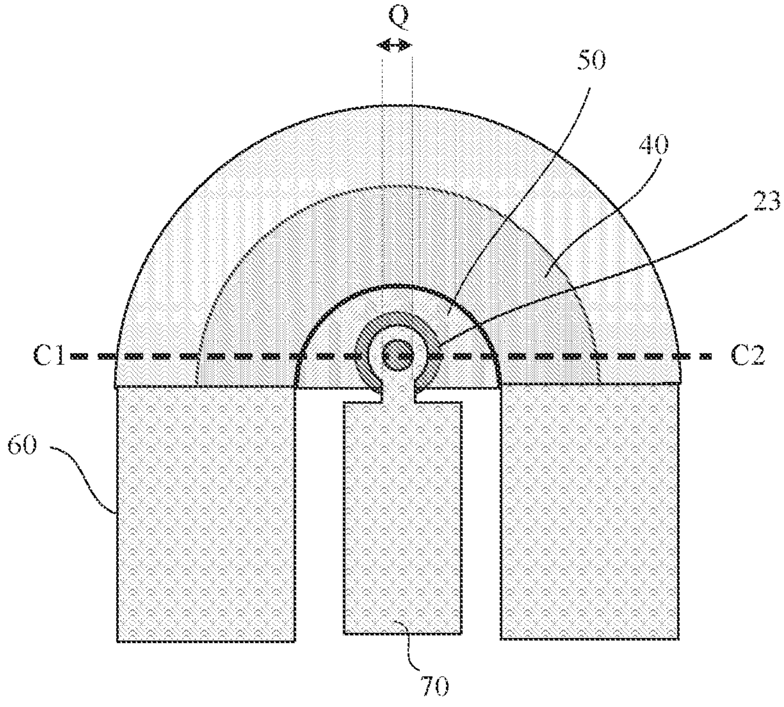
FIG. 11 is a top view of a VCSEL according to an embodiment of the present application.

For example, FIG. 11 is a top view of a VCSEL according to an embodiment of the present application, a sectional view of a structure taken along a line C1-C2 in FIG. 11 is a sectional view of the structure shown in FIG. 8. Referring to FIG. 11 and in conjunction with FIG. 8, the mesa structure 202 in the VCSEL may be a single, and the formed trench 201 surrounds the mesa structure 202. If the mesa structure 202 is cylindrical structure, the trench 201 may be a ring structure. The N-type ohmic metal layer 40 is formed on the side of the N-type ohmic contact layer 21 away from the substrate 10 along the direction (i.e., a direction surrounding the mesa structure 202) in which the trench 201 surrounds the mesa structure 202, and the N-type ohmic metal layer 40 surrounds the mesa structure 202 to form an arc-shaped N-type ohmic metal layer 40. Therefore, in FIG. 11, the N-type ohmic metal layer 40 is located on the outer periphery of the mesa structure 202. After the first passivation layer 50 is subsequently formed on the side of the semiconductor epitaxial structure 20 away from the substrate 10 and the sidewall and the bottom of the trench 201, the first passivation layer 50 is etched to form the first via A on the side of the N-type ohmic metal layer 40 away from the substrate 10 to expose the N-type ohmic metal layer 40. In the mesa structure 202, in the process of forming the second via B on the side of the P-type ohmic contact layer 25 away from the substrate 10 to expose P-type ohmic contact layer 25, correspondingly, the first via A and the second via B are the ringlike vias. Therefore, in FIG. 11, the upper portions of the N-type ohmic metal layer 40 located on both opposite sides of the mesa structure 202 have the first via A; and in the mesa structure 202, the number of second vias B formed on the side of the P-type ohmic contact layer 25 away from the substrate 10 is also two (the second via B is shown as two in the drawing viewing angle of FIG. 8, but referring to FIGS. 8 and 11, the shape of the second via B may be a ring, that is, the number of second vias B may also be understood as one).

In an embodiment, the number of mesa structures 202 is above one, and forming the N-type ohmic metal layer 40 on the side of the portion of the N-type ohmic contact layer 21 away from the substrate 10 and exposed from the trench 201 includes: forming the N-type ohmic metal layer 40 shared by a plurality of mesa structures 202 in trench 201 on same sides of the plurality of mesa structures 202.

Figure 12:
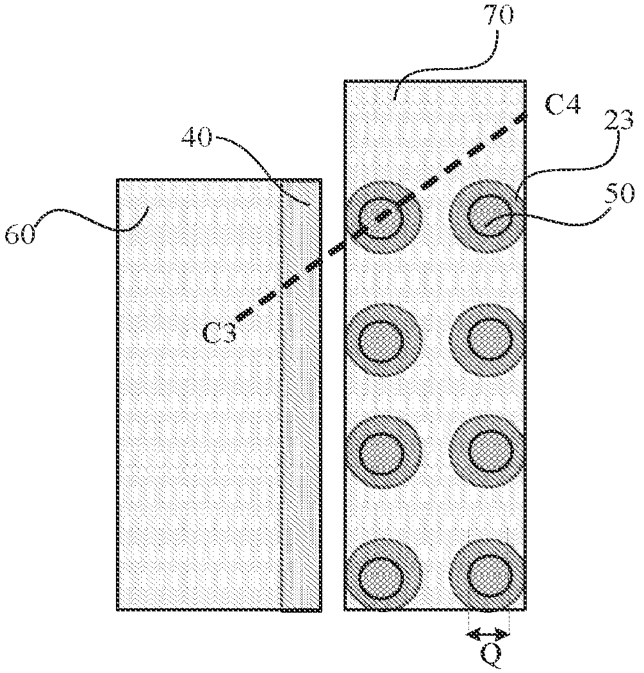
FIG. 12 is a top view of another VCSEL according to an embodiment of the present application.

For example, referring to FIG. 12, there are two rows of emitter platforms, and the left side of the emitter platforms in the left half row has an N-type metal, which can be shared with the emitter platforms in the right half row. Because the N-type ohmic metal layer (n contact layer) of the two rows of emitter platforms are connected, the plurality of mesa structures 202 can share the N-type ohmic metal layer.

For example, FIG. 12 is a top view of another VCSEL according to an embodiment of the present application. Referring to FIG. 12, the number of mesa structures 202 in the VCSEL may be above one, and the plurality of mesa structures 201 are formed by forming the plurality of trenches 201. FIG. 12 exemplarily shows eight mesa structures 202. The formed N-type ohmic metal layer 40 is located in the trench 201 on same sides of eight mesa structures 40, and the shape of the N-type ohmic metal layer 40 may be strip-shaped. After the first passivation layer 50 is subsequently formed on the side of the semiconductor epitaxial structure 20 away from the substrate 10, and on the sidewall and the bottom of the trench 201, the first passivation layer 50 is etched to form the first via A on the side of the N-type ohmic metal layer 40 away from the substrate 10 to expose the N-type ohmic metal layer 40. In the mesa structure 202, in the process of forming the second via B on the side of the P-type ohmic contact layer 25 away from the substrate 10 to expose the P-type ohmic contact layer 25, the shape formed by the first via A is strip-shaped, and the shape formed by the second via B is still a ring. The first electrode layer 60 is a electrode layer shared by eight mesa structures 202, the first electrode layer 60 is a cathode pad metal layer, the second electrode layer 70 formed in the region where the eight mesa structures 202 are located is also a shared electrode layer, the second electrode layer 70 is an anode pad metal layer, and eight mesa structures 202 are connected in parallel. The current signal flows to the P-type ohmic metal layer of each mesa structure 202 through the anode pad metal layer, passes through the respective P-type DBR layer 24, the quantum well layer 23, and the N-type DBR layer 22, flows to the shared N-type ohmic metal layer 40 through the entire N-type ohmic contact layer 21, and flows out through the cathode pad metal layer, thereby forming a closed circuit.

Figure 13:
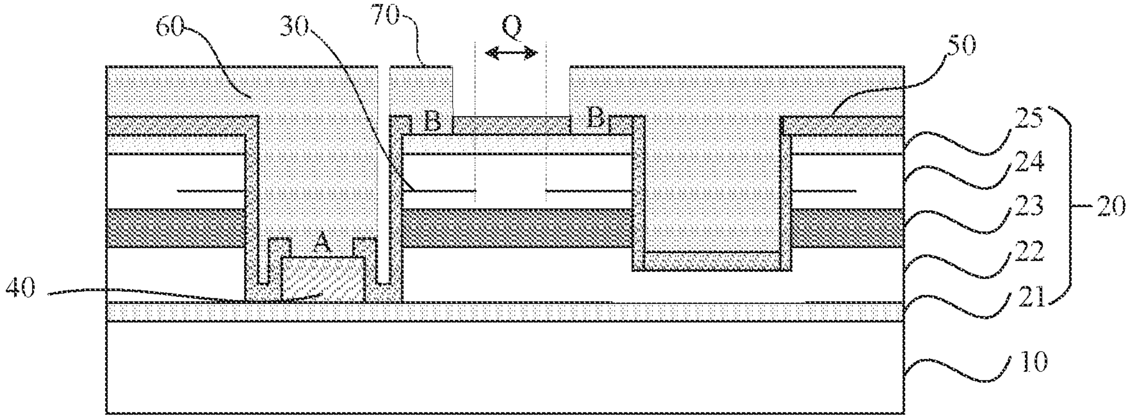
FIG. 13 is a sectional view taken along a line C3-C4 of FIG. 12.
Figure 14:
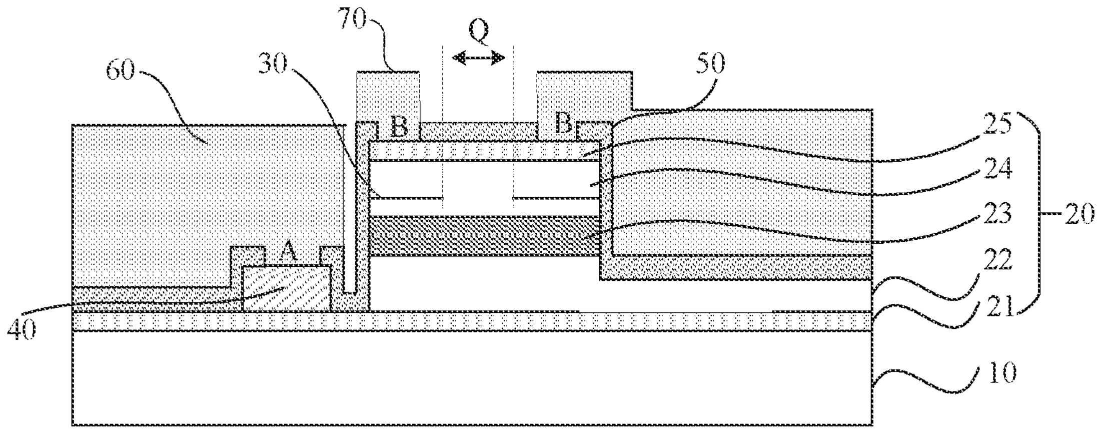
FIG. 14 is another sectional view taken along a line C3-C4 of FIG. 12.

FIG. 13 is a sectional view taken along a line C3-C4 in FIG. 12. Referring to FIG. 13, when the semiconductor epitaxial layer structure 20 is etched, in the peripheral region at the position where the mesa structure 202 is formed, a partial region on the side where the N-type ohmic metal layer 40 is located may be etched to the N-type ohmic contact layer 21 at the side where the N-type ohmic metal layer 40 is located, and a partial region on the other side where the N-type ohmic metal layer is not located 40 may be etched to the N-type DBR layer 22 at the other side where the N-type ohmic metal layer 40 is not located. FIG. 14 is another sectional view taken along a line C3-C4 in FIG. 12. Referring to FIG. 14, when the semiconductor epitaxial layer structure 20 is etched, in the peripheral region at the position where the mesa structure 202 is formed, an entire region on the side where the N-type ohmic metal layer 40 is located may be etched to the N-type ohmic contact layer 21 at the side where the N-type ohmic metal layer 40 is located, and an entire region on the other side where the N-type ohmic metal layer 40 is not located may be etched to the N-type DBR layer 22 at the other side where the N-type ohmic metal layer 40 is not located.

Referring to FIG. 12, it can be designed according to the N-type conductive layer. For example, the left side of FIG. 12 is designed with n pad, but the right side is not designed. Only single side n pad is needed for the two rows of mesa to satisfy the light emitting uniformity. If there are a plurality of rows, the emitter uniformity may be deteriorated because the N-type conductive layer is excessively long and the resistance is excessively large.

In an embodiment, in FIG. 12, the single side n pad may be provided, the double side pad may also be provided, and the arrangement may be selected according to the resistance of the N-type conductive layer.

In another embodiment, referring to FIGS. 13 to 14, in a class of examples, the left and right sides may be etched to expose the N-type ohmic metal layer. However, in another example, there is only an N-type ohmic metal layer on the left side, and the emitter units on the right side are all connected in parallel, so that complete insulation between the emitter units may not be required.

Referring to FIG. 8, the embodiment of the present application further provides a VCSEL, and the VCSEL includes a substrate 10 and a semiconductor epitaxial structure 20 located on a side of the substrate 10, an N-type ohmic metal layer 40, a first passivation layer 50, a first electrode layer 60, a P-type ohmic metal layer and a second electrode layer 70.

The semiconductor epitaxial structure 20 includes an N-type ohmic contact layer 21, an N-type DBR layer 22, a quantum well layer 23, a P-type DBR layer 24, and a P-type ohmic contact layer 25 sequentially laminated on the substrate 10, the semiconductor epitaxial structure 20 includes a trench 201 and a mesa structure 202 surrounded by the trench 201, a portion of the N-type ohmic contact layer 21 is exposed from the trench 201, the mesa structure 202 includes a current confinement layer 30, and the current confinement layer 30 has an oxide aperture for forming a emitter region Q of the mesa structure 202.

The N-type ohmic metal layer 40 is located on a bottom of the trench 201, and a distance between the N-type ohmic metal layer 40 and a sidewall of the trench 201 is greater than zero.

The first passivation layer 50 is located on a side of the semiconductor epitaxial structure 20 away from the substrate 10 and on a sidewall and a bottom of the trench 201, the first passivation layer 50 includes a first via A and a second via B, the N-type ohmic metal layer 40 is exposed from the first via A, the P-type ohmic contact layer 25 in the mesa structure 202 is exposed from the second via B, and the first via A and the second via B are formed in a same etching process.

The first electrode layer 60 is in contact with the N-type ohmic metal layer 40 exposed from the first via A, the P-type ohmic metal layer is in contact with the P-type ohmic contact layer 25 exposed from the second via B, the second electrode layer 70 is located on a side of the P-type ohmic metal layer away from the P-type ohmic contact layer 25, and the N-type electrode layer (the first electrode layer 60), the P-type ohmic metal layer and the P-type electrode layer (the second electrode layer 70) are formed in a same metal deposition process.

In the VCSEL provided in the embodiment of the present application, the first passivation layer 50 includes the first via A and the second via B, the N-type ohmic metal layer 40 is exposed from the first via A, the P-type ohmic contact layer 25 in the mesa structure 202 is exposed from the second via B, and the first via A and the second via B are formed in the same etching process; and in the same etching process, the first passivation layer 50 located on the side of the N-type ohmic metal layer 40 away from the substrate 10 is etched to form the first via A on the side of the N-type ohmic metal layer 40 away from the substrate 10 to expose the N-type ohmic metal layer 40, and the first passivation layer 50 located on the side of the P-type ohmic contact layer 25 away from the substrate 10 is etched in the mesa structure 202 to form the second via B on the side of the P-type ohmic contact layer 25 away from the substrate 10 in the mesa structure 202 to expose the P-type ohmic contact layer 25, thus reducing the number of times of via etching process. In addition, the N-type electrode layer, the P-type ohmic metal layer and the P-type electrode layer in the VCSEL are formed in the same metal deposition process. In the same metal deposition process, the first electrode layer 60 is formed in the first via A, and the P-type ohmic metal layer and the second electrode layer 70 are sequentially formed in the second via B, thereby reducing the number of times of metal deposition process and the amount of metal consumptions, thereby improving the manufacturing efficiency of the laser, shortening the manufacturing duration of the laser and reducing the manufacturing cost of the laser.

In an embodiment, the VCSEL further includes a second passivation layer 80, where the second passivation layer 80 is located between the semiconductor epitaxial structure 20 and the first passivation layer 50, and the second passivation layer 80 covers a surface of the side of the semiconductor epitaxial structure 20 away from the substrate 10.

In an embodiment, the N-type DBR layer and P-type DBR layer are respectively formed by laminating two materials having different refractive indices of the aluminum gallium arsenic material layer and the gallium arsenide material layer, or by laminating two materials having different refractive indices of the aluminum gallium arsenic material layer having the high aluminum component and the aluminum gallium arsenic material layer having the low aluminum component.

In an embodiment, the number of mesa structures 202 is above one, and the N-type ohmic metal layer is an N-type ohmic metal layer 40 shared by a plurality of mesa structures 202, and is located in the trench 201 on same sides of the plurality of mesa structures 202.

In an embodiment, the N-type ohmic metal layer may be located in the trench 201 on the plurality of sides of the mesa structure 202.

The embodiment of the present application further provides a VCSEL, and the VCSEL includes a substrate 10 and a semiconductor epitaxial structure 20 located on a side of the substrate 10, an N-type ohmic metal layer 40, a first electrode layer 60, a P-type ohmic metal layer and a second electrode layer 70.

The semiconductor epitaxial structure 20 includes an N-type ohmic contact layer 21, an N-type DBR layer 22, a quantum well layer 23, a P-type DBR layer 24, and a P-type ohmic contact layer 25 sequentially laminated on the substrate 10, the semiconductor epitaxial structure 20 includes a trench 201 and a mesa structure 202 surrounded by the trench 201, a portion of the N-type ohmic contact layer 21 is exposed from the trench 201, the mesa structure 202 includes a current confinement layer 30, and the current confinement layer 30 has an oxide aperture for forming a emitter region Q of the mesa structure 202.

The N-type ohmic metal layer 40 is located on a bottom of the trench 201, and a distance between the N-type ohmic metal layer 40 and a sidewall of the trench 201 is greater than zero.

The first electrode layer 60 is in contact with the N-type ohmic metal layer 40 exposed from the first via A, the P-type ohmic metal layer is in contact with the P-type ohmic contact layer 25 exposed from the second via B, the P-type ohmic metal layer and the second electrode layer 70 may be the same layer, and the N-type electrode layer, the P-type ohmic metal layer and the P-type electrode layer are formed in a same metal deposition process.

It will be understood by those skilled in the art that the present application is not limited to the specific embodiments described herein. Those skilled in the art can make various modifications, readjustments and substitutions without departing from the scope of the present application. The present application is not limited to the above embodiments but may include more other equivalent embodiments without departing from the present inventive concept.

What is claimed is:

1. A manufacturing method of a VCSEL, comprising:

providing a substrate, and forming a semiconductor epitaxial structure on a side of the substrate, wherein the semiconductor epitaxial structure comprises an N-type ohmic contact layer, an N-type DBR layer, a quantum well layer, a P-type DBR layer, and a P-type ohmic contact layer which are sequentially formed on the substrate;

etching a trench on the semiconductor epitaxial structure to form a mesa structure, wherein a portion of the N-type ohmic contact layer is exposed from the trench;

forming a current confinement layer in the mesa structure, wherein the current confinement layer has an oxide aperture for forming an emitter region of the mesa structure;

forming an N-type ohmic metal layer on a side of the portion of the N-type ohmic contact layer away from the substrate and exposed from the trench; wherein a distance between the N-type ohmic metal layer and a sidewall of the trench is greater than zero;

forming a first passivation layer on a side of the semiconductor epitaxial structure away from the substrate, and on a sidewall and a bottom of the trench; and in a same etching process, etching the first passivation layer located on a side of the N-type ohmic metal layer away from the substrate to form a first via on a side of the N-type ohmic metal layer away from the substrate to expose the N-type ohmic metal layer, and etching the first passivation layer located on a side of the P-type ohmic contact layer away from the substrate in the mesa structure to form a second via on a side of the P-type ohmic contact layer away from the substrate in the mesa structure to expose the P-type ohmic contact layer; and in a same metal deposition process and using a same metal material, forming a first electrode layer in the first via, and sequentially forming a P-type ohmic metal layer and a second electrode layer in the second via.

2. The manufacturing method of the VCSEL of claim 1, wherein a second passivation layer is further provided between the first passivation layer on the side of the semiconductor epitaxial structure away from the substrate, and the semiconductor epitaxial structure, before etching the trench on the semiconductor epitaxial structure to form the mesa structure, and the manufacturing method of the VCSEL further comprises:

forming a second passivation layer on the side of the semiconductor epitaxial structure away from the substrate, and etching a second passivation layer located in a region where the trench is located to expose the semiconductor epitaxial structure to be etched.

3. The manufacturing method of the VCSEL of claim 1, wherein the N-type DBR layer is formed by laminating an aluminum gallium arsenic material layer and a gallium arsenide material layer, and the P-type DBR layer is formed by laminating an aluminum gallium arsenic material layer and a gallium arsenide material layer; or the N-type DBR layer is formed by laminating a first aluminum gallium arsenic material layer, and a second aluminum gallium arsenic material layer, and the P-type DBR layer is formed by laminating third aluminum gallium arsenic material layer, and fourth aluminum gallium arsenic material layer; wherein an aluminum component of the first aluminum gallium arsenic material layer is greater than an aluminum component of the second aluminum gallium arsenic material layer, and an aluminum component of the third aluminum gallium arsenic material layer is greater than an aluminum component of the fourth aluminum gallium arsenic material layer.

4. The manufacturing method of the VCSEL of claim 3, wherein forming the current confinement layer in the mesa structure comprises:

wet oxidizing the aluminum gallium arsenic material layer having a highest aluminum component in the P-type DBR layer exposed from the trench to form the current confinement layer.

5. The manufacturing method of the VCSEL of claim 1, wherein one mesa structure is arranged, and forming the N-type ohmic metal layer on the side of the portion of the N-type ohmic contact layer exposed from the trench away from the substrate comprises:

forming the N-type ohmic metal layer on the side of the N-type ohmic contact layer away from the substrate, along a direction in which the trench surrounds the one mesa structure.

6. The manufacturing method of the VCSEL of claim 1, wherein a plurality of mesa structures are arranged, and forming the N-type ohmic metal layer on the side of the portion of the N-type ohmic contact layer exposed from the trench away from the substrate comprises:

forming the N-type ohmic metal layer shared by the plurality of mesa structures in the trench on same side of the plurality of mesa structures.

7. A VCSEL, comprising:

a substrate, and a semiconductor epitaxial structure located on a side of the substrate, wherein the semiconductor epitaxial structure comprises an N-type ohmic contact layer, an N-type DBR layer, a quantum well layer, a P-type DBR layer, and a P-type ohmic contact layer which are sequentially laminated on the substrate, the semiconductor epitaxial structure comprises a trench, and a mesa structure surrounded by the trench, a portion of the N-type ohmic contact layer is exposed from the trench, the mesa structure comprises a current confinement layer, and the current confinement layer has an oxide aperture for forming an emitter region of the mesa structure;

an N-type ohmic metal layer, wherein the N-type ohmic metal layer is located on a bottom of the trench, and a distance between the N-type ohmic metal layer and a sidewall of the trench is greater than zero;

a first passivation layer, wherein the first passivation layer is located on a side of the semiconductor epitaxial structure away from the substrate and on a sidewall and a bottom of the trench, the first passivation layer comprises a first via and a second via, the N-type ohmic metal layer is exposed from the first via, the P-type ohmic contact layer in the mesa structure is exposed from the second via, and the first via and the second via are formed in a same etching process; and a first electrode layer, a P-type ohmic metal layer and a second electrode layer, wherein the first electrode layer is in contact with the N-type ohmic metal layer exposed from the first via, the P-type ohmic metal layer is in contact with the P-type ohmic contact layer exposed from the second via, the second electrode layer is located on a side of the P-type ohmic metal layer away from the P-type ohmic contact layer, and the first electrode layer, the P-type ohmic metal layer and the second electrode layer are formed in a same metal deposition process and using a same metal material.

8. The VCSEL of claim 7, further comprising:

a second passivation layer, wherein the second passivation layer is located between the semiconductor epitaxial structure and the first passivation layer, and the second passivation layer covers a surface of the side of the semiconductor epitaxial structure away from the substrate.

9. The VCSEL of claim 7, wherein the N-type DBR layer is formed by laminating an aluminum gallium arsenic material layer and a gallium arsenide material layer, and the P-type DBR layer is formed by laminating an aluminum gallium arsenic material layer and a gallium arsenide material layer; or the N-type DBR layer is formed by laminating a first aluminum gallium arsenic material layer, and a second aluminum gallium arsenic material layer, and the P-type DBR layer is formed by laminating third aluminum gallium arsenic material layer, and fourth aluminum gallium arsenic material layer; wherein an aluminum component of the first aluminum gallium arsenic material layer is greater than an aluminum component of the second aluminum gallium arsenic material layer, and an aluminum component of the third aluminum gallium arsenic material layer is greater than an aluminum component of the fourth aluminum gallium arsenic material layer.

10. The VCSEL of claim 7, wherein a plurality of mesa structures are arranged, and the N-type ohmic metal layer is an N-type ohmic metal layer shared by the plurality of mesa structures, and is located in the trench on a same side of the plurality of mesa structures.

11. The VCSEL of claim 9, wherein a plurality of mesa structures are arranged, and the N-type ohmic metal layer is an N-type ohmic metal layer shared by the plurality of mesa structures, and is located in the trench on a same side of the plurality of mesa structures.

* * * * *